United States Patent [19]

Doblhofer

[11] 4,091,277

[45] May 23, 1978

[54] PHOTON DETECTION AND COUNTING SYSTEM

[75] Inventor: Karl Doblhofer, Berlin, Germany

[73] Assignee: Max-Planck-Gesellschaft zur Forderung der Wissenschaftern e.v., Gottingen, Germany

[21] Appl. No.: 725,561

[22] Filed: Sep. 22, 1976

[30] Foreign Application Priority Data

Oct. 1, 1975 Germany .............................. 2543863

[51] Int. Cl.² ............................................. H01J 39/12
[52] U.S. Cl. .................................. 250/214 R; 250/207
[58] Field of Search .................... 250/214 R, 206, 207; 328/173; 340/347 AD

[56] References Cited

U.S. PATENT DOCUMENTS

| 3,393,319 | 7/1968 | Randall et al. ........................ 250/207 |
| 3,714,441 | 1/1973 | Kreda .................................... 250/207 |
| 3,721,824 | 3/1973 | Bristol ................................ 250/207 X |
| 3,867,628 | 2/1975 | Brown .................................. 250/206 |
| 3,898,452 | 8/1975 | Hertel ................................... 250/207 |
| 3,947,841 | 3/1976 | Tumolillo ........................ 250/207 X |

*Primary Examiner*—David C. Nelms
*Assistant Examiner*—Vincent J. Sunderdick
*Attorney, Agent, or Firm*—Flynn & Frishauf

[57] ABSTRACT

A photo multiplier tube is connected through a wave shaping and coupling circuit to an evaluation circuit; to provide for simple evaluation, for example, in an integrator, the coupling and wave shaping circuit includes an amplifier and a limiter, preferably a Zener diode connected through suitable coupling resistors to the integrator. Switches are provided to close the circuit from the photomultiplier tube (PMT) to the integrator, connected with a photon emission event trigger circuit so that, under non-event producing conditions, the integrator is disconnected from the PMT to prevent evaluating and possibly indicating spurious dark current noise pulses.

9 Claims, 1 Drawing Figure

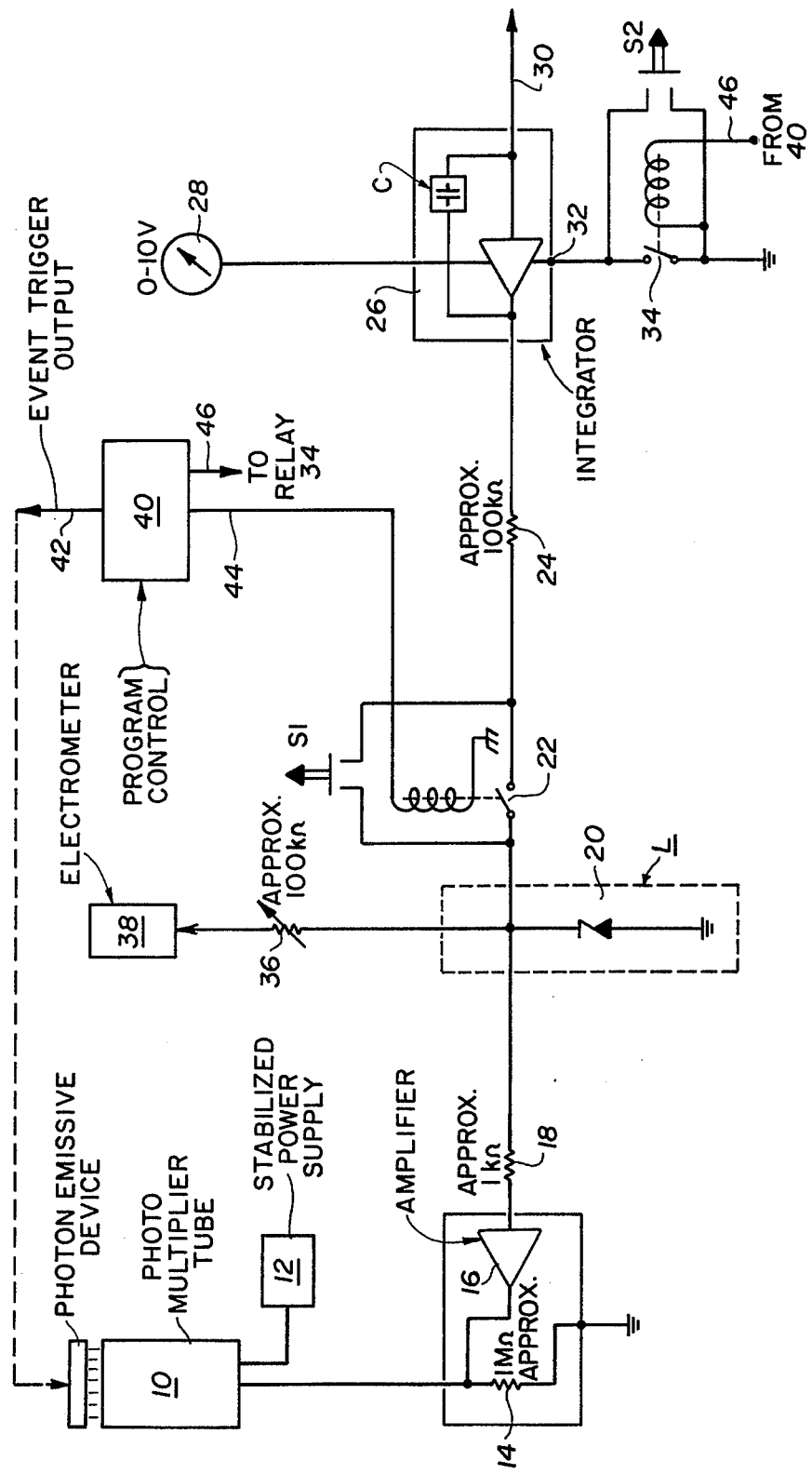

PHOTON DETECTION AND COUNTING SYSTEM

Cross reference to pertinent literature: "How to Make Every Photon Count" by M. R. Zatzick, "Electro-Optical Systems Design", June 1972, pp. 20-27.

The present invention relates to a photon detection and counting system including a photo multiplier tube (PMT), the output of which is connected through a pulse and wave shaping circuit to an evaluation circuit which includes a measuring instrument, print out apparatus, or the like.

The outputs from the PMT have to be normalized or standardized so that they can be efficiently and readily counted. One system of this type is described in the cross referenced literature. The output signal of a PMT, which includes pulses corresponding to incidence of photons, or photon emissive events sensed by the PMT are conducted to an amplifier-discriminator circuit, which standardizes the output signal of the PMT to a stable base line. These signals are then applied to a threshold amplifier, which, for each pulse applied to its input which exceeds the threshold set by the threshold amplifier, provides an output pulse of constant amplitude and duration which is independent of the amplitude, or magnitude, and duration of the input signal itself. These standardized output pulse signals are then applied to a digital indicator, to the input circuit of a computer, or to an oscilliscope which is used to calibrate the entire system. Of course, the outputs can be selectively connected to more than one of these output-evaluating devices.

It has previously been proposed to connect the output signal of the PMT directly to an electrometer in order to integrate the output signals therein over a time base. The output then will be an analog indication which, however, is relatively inaccurate since the energy content of the separate photon events, which cause pulses to be emitted by the PMT changes by changes arising in the PMT itself by changes in the focusing conditions, secondary emission threshold values and other temperature effects arising within the PMT itself.

It is an object of the present invention to provide a photon detection and counting system which is accurate but, in contrast to systems proposed in the prior art, is simple and requires but little by way of apparatus, and especially, does no require expensive highly accurate and rapid sophisticated electronic circuitry.

Subject matter of the present invention: Briefly, a wave shaping and coupling circuit is provided to connect the output of the PM tube to an evaluation circuit which, includes a summing integrator, in which the wave shaping and coupling circuit includes an amplifier and a limiter connected to the amplifier; the amplifier may have an amplification factor of 1,000 or so, preferably not less, and should be essentially immune to overload, and have a rapid overload-recovery time.

In accordance with a feature of the invention, the integrating circuit is disabled during the time when no photon events are expected. This can readily be effected by connecting a programmable trigger circuit to a relay, or the like; the programmer will trigger a circuit programming the photon-emissive event, and, at the same time, connecting the integrator to the output of the PM tube only when the photo-emissive event has been commanded; at other times, the integrator is separated from the PMT so that spuriously arising dark current pulses will not be sensed or counted.

The system is simple and highly accurate; disconnecting the PMT from the evaluation circuit unless a photon-emissive event has been triggered additionally increases the accuracy of measurement.

The invention will be described by way of example with reference to the accompanying drawing wherein the single FIGURE is an illustrative schematic diagram of the system in accordance with the present invention.

A PMT 10 is supplied with power from a stabilized power supply source (12). The anode of the PMT is connected over a working resistor 14 to ground, or chassis, and, further is connected across a high gain, broad band amplifier 16 to a resistor 18 of about 1,000 ohms to a limiter circuit L. The amplifier 16 should, preferably, have high tolerance to overload and rapid overload-recovery characteristics. The limiter L is formed by a Zener doide 20 connected between the junction of the output side of resistor 18 and ground, or chassis. The output of the limiter circuit is connected through the working contacts of a relay 22, which is bridged by a manually operated push switch S1 through a coupling resistor 24 of about 100 kilo ohms to the input of an integrator 26. Integrator 26, preferably, includes an operational amplifier having a capacitor C in its feedback circuit. The integrator integrates the amplified clipped, or limited, pulses from the PMT 10 and provides an integrated signal which corresponds to the number of the pulses applied to the integrator 26. This signal can be indicated by a cumulative indicator 28, or can be further processed by being taken off an output connection line 30, for example, by being applied to an output printer, to a computer, input terminal, or the like.

The feedback capacity C connecting the output of the operational amplifier of integrator 26 back to its input, preferably, is variable, that is, can be switched between various capacitor values in order to provide for a plurality of measuring ranges.

The integrator has a reset, or discharge terminal 32 which is connected through the working contact of a second relay 34, bridged by switch S2 to ground, or chassis. Both relays 22, 34, preferably are reed relays, sealed into a tube filled with a protective gas. The connection between resistor 18 and the Zener diode 20 of limiter L is further connected through a switchable resistor 36 to an electrometer 38. Typical resistance value for switchable resistance value for switchable resistor 36 is about 100 kilo ohms. The electrometer will then indicate the number of the photo events per unit of time, that is, the total photon energy.

Operation: The PMT 10 provides current pulses at each photon event, which have a current value of about $10^{-8}$ A. The circuit, with the resistance values above referred to then will store in the integrator 26 for each photon event a charge of about $10^{-11}$ Coulomb. The measuring range of the integrator can be adjusted by suitable selection of the feedback capacitor C, for example, to provide at full scale deflection of indicator 28 an indication when the integrator has stored $10^{-9}$ Coulomb, corresponding to about 100 photon events at its setting of maximum sensitivity; at a position of lesser sensitivity, full scale deflection can correspond to $10^{-4}$ Coulomb, corresponding to about $10^7$ photon events.

The system permits analog, or digital counting of photon events with very few, and inexpensive, components. The voltage pulses across the resistor 14 have a value of about $10^{-2}$ V and are amplified by amplifier 16 which, preferably, has an amplification factor a equal to 1,000 or so. This is an amplification factor which can be readily attained by commercially available, inexpensive operational amplifiers. The Zener diode 20 of the limiter L then limits the voltage pulses to an amplitude of 1V; the limited pulses are applied through relay 22, then closed, over resistor 24 to integrator 26 which, for any typical photon event, receives a charge of $10^{-11}$ Coulomb. This charge value depends on the time constant of the amplifier 16 and its recovery time after overload. In actual practice, it has been found that the variation of charge for each photon event will average out already after counting of about 10 photon events. It is thus not necessary to provide an expensive pulse wave shaping circuit in which a standardizing pulse generator is used, controlled by primary current pulses. This very expensive - since very rapidly operating - component can be omitted.

The relays 22 and 34 which, preferably are reed relays, but may be other types of control switches, further increase the sensitivity of the system when measuring photon or other light pulses. Closing of the circuit through relay 22 is controlled to occur only during the time that the light pulse is in effect. This is commanded by means of a program control 40. Program control 40 has three outputs. Output 42 is connected to trigger the event which causes the light pulse to be emitted; output 44 is connected to the control coil, or control terminal of the relay 22 to close the relay and hold it closed only during the time period when the light pulse occurs. A third output 46 is delayed, for example, by being triggered by the trailing flank of the pulse from output 42 to reset the integrator 26, by discharging the integrator. The indicator 28, of course, is then arranged to hold its previous indication until the next pulse occurs.

The temporal position of the control signals at the outputs 42, 44 insures that the contact of relay 22 is closed as soon as the light pulse begins and that the contacts of relay 22 open after the light pulse has terminated. Since the relay may have some operating time, the pulse on terminal 44 may occur just slightly before the event trigger pulse on terminal 42 is initiated. For example, when investigating cathodic electroluminescence in non-aqueous solutions, the closing time of the reed relay 22 was set to be about 2 milliseconds; the control signal at the output 44 was programmed to occur about 0.2 milliseconds in advance of the trigger signal at terminal 44, since luminescence occurs practically without delay, in order to take into consideration the response time of the relay 22. The PMT was cooled to dry ice temperature during the measuring step. Only a few ten or so dark current pulses per second were fund under such conditions. It is thus possible to measure short light flashes without normally counting a single dark current pulse, since the dark current pulses are distributed, based on statisticaly distribution.

The control signal at output 46 closes the terminals of relay 34 which discharge the integrator and reset the integrator for a new measurement for a subsequent pulse from program control 40, trigerring a subsequent photon-emissive event.

Electrometer 38 permits continuous indication of the pulse rate. It permits supevision of the dark current, as well as of the light current, or pulse current. In the practical embodiment, resistor 36 has a value of about 100 kilo ohms, and a full scale deflection of $10^{-8}$A scale of the electrometer corresponding to about 1,000 pulses per second. A d-c amplifier with a subsequently connected indicator instrument may be used instead. If the resistor 36 can be switched between various resistance values, different measuring ranges for pulse rate can be obtained. The programming control 40 may, of course, be set to provide pulses at terminal 46 to the relay 34 only after a plurality of photon events have been triggered, so that the number of integrated light pulses, integrated in the integrator 26 and indicated at indicator 28, or transmitted over line 30 can be suitably selected.

Various changes and modifications may be made within the scope of the inventive concept.

I claim:

1. Photon detection and counting system comprising a photon multiplier tube (PMT) (10);
   an evaluation circuit means 26, 28, 30) including a summing integrator (26), and controlled reset switch means (34) connected to the integrator (26) and resetting the integration by the integrator when the switch means is controlled to be closed to start a new summing cycle;
   and a coupling circuit connecting the output of the photo multiplier tube (10) to the evaluation circuit (26, 28, 30) and providing standardized pulses thereto representative of photons sensed by the photo multiplier tube, including
   an amplifier (16), a limiter (L) connected to the amplifier (16) to limit the output signals from the amplifier being applied to the evaluation circuit (26, 28, 30), and controlled switch means (22) connecting the output of the limiter (L) to the evaluation circuit (26, 28, 30).

2. System according to claim 1 wherein the limiter (L) comprises a clipping diode (20).

3. System according to claim 1 wherein the limiter (L) comprises a Zener diode (20).

4. System according to claim 3 further including a program control unit (40) providing output pulses to trigger a a photon-emissive event, and to command, selectively, the controlled switch means (22) to close only during the occurrence of a photon emissive event.

5. System according to claim 4 wherein the, the controlled reset switch means (34) is connected to and controlled by said program control unit (40) for resetting the evaluaton circuit means after the photon emissive event has terminated.

6. System according to claim 1 wherein the controlled reset switch means (34).

7. System according to claim 1 wherein the evaluation circuit means includes an indicator (28, 30) connected to the integrator and providing an output indication representative of the charge connected to the integrator (26) and summed over a predetermined period of time.

8. System according to claim 1 including a high resistance input electrometer 38 connected to the coupling circuit to indicate the output pulses derived from the photo multiplier tube (10) and as amplified and limited.

9. System according to claim 1 wherein the amplifier (16) has an amplification factor in the order of about 1,000, high overload tolerance and rapid recovery after overload.

* * * * *